US011849543B2

(12) United States Patent  
Clancy et al.

(10) Patent No.: US 11,849,543 B2
(45) Date of Patent: Dec. 19, 2023

(54) PLASMA ASHING FOR COATED DEVICES

(71) Applicant: HZO, Inc., Morrisville, NC (US)

(72) Inventors: Sean Clancy, Apex, NC (US); Benjamin Lawrence, Salt Lake City, UT (US); Alexander Niebroski, Fuquay-Varina, NC (US)

(*) Notice: Subject to any disclaimer, the term of this patent is extended or adjusted under 35 U.S.C. 154(b) by 374 days.

(21) Appl. No.: 17/084,618

(22) Filed: Oct. 29, 2020

(65) Prior Publication Data

US 2021/0127497 A1    Apr. 29, 2021

Related U.S. Application Data

(60) Provisional application No. 63/037,100, filed on Jun. 10, 2020, provisional application No. 63/014,098, filed on Apr. 22, 2020, provisional application No. 62/927,619, filed on Oct. 29, 2019.

(51) Int. Cl.
| H05K 3/00 | (2006.01) |
| H05K 3/22 | (2006.01) |
| H01J 37/32 | (2006.01) |
| G03F 7/038 | (2006.01) |
| G03F 7/039 | (2006.01) |

(52) U.S. Cl.
CPC .......... *H05K 3/0041* (2013.01); *G03F 7/038* (2013.01); *G03F 7/039* (2013.01); *H01J 37/3244* (2013.01); *H01J 37/32963* (2013.01); *H05K 3/0023* (2013.01); *H05K 3/22* (2013.01); *H05K 2203/095* (2013.01)

(58) Field of Classification Search
CPC . H05K 3/0023; H05K 3/0041; H01J 37/3244; H01J 37/32963; H01J 37/32844
See application file for complete search history.

(56) References Cited

U.S. PATENT DOCUMENTS

| 4,734,152 A * | 3/1988 | Geis ................. H01L 21/31138 216/45 |
| 4,946,549 A * | 8/1990 | Bachman ................ G03F 7/427 216/41 |
| 8,268,181 B2 | 9/2012 | Srivastava et al. |
| 2008/0012008 A1 * | 1/2008 | Song ..................... H01L 27/283 438/151 |
| 2013/0143406 A1 * | 6/2013 | Hsu ................... H01L 21/31133 257/E21.252 |

(Continued)

FOREIGN PATENT DOCUMENTS

WO    2013048013    4/2013

OTHER PUBLICATIONS

Copenheaver "PCT International Search Report for International Application No. PCT/US2020/058068" dated Feb. 2, 2021, 3 pages.

(Continued)

*Primary Examiner* — Binh X Tran
(74) *Attorney, Agent, or Firm* — Intellectual Strategies

(57) ABSTRACT

A plasma ashing system includes a plasma generator configured to generate a plasma from a gas source. The system further includes a plasma reaction chamber configured to house a substrate comprising a Parylene coating, wherein the plasma reaction chamber is configured to expose surfaces of the Parylene coating on the substrate to the plasma, wherein the plasma is configured to remove portions of the Parylene coating on the substrate.

10 Claims, 5 Drawing Sheets

(56) References Cited

U.S. PATENT DOCUMENTS

| | | | |
|---|---|---|---|
| 2016/0163563 A1* | 6/2016 | Yoshida | H01L 21/31138 |
| | | | 438/725 |
| 2017/0248849 A1* | 8/2017 | Liou | G03F 7/427 |
| 2020/0126769 A1 | 4/2020 | Askin, III et al. | |
| 2021/0134631 A1* | 5/2021 | Lawrence | G03F 7/427 |
| 2021/0407773 A1* | 12/2021 | Lawrence | H01J 37/3447 |

OTHER PUBLICATIONS

Copenheaver "Written Opinion of the International Searching Authority for International Application No. PCT/US2020/058068" dated Feb. 2, 2021, 7 pages.

Baharlou "PCT International Preliminary Report on Patentability for International Application No. PCT/US2020/058068" dated May 3, 2022, 8 pages.

* cited by examiner

PLASMA ASHING FOR COATED DEVICES

CROSS-REFERENCES TO RELATED APPLICATIONS

This application claims the benefit of U.S. Provisional Patent Application No. 62/927,619, filed Oct. 29, 2019, which is incorporated herein by reference in its entirety. This application claims the benefit of U.S. Provisional Patent Application No. 63/014,098, filed Apr. 22, 2020, which is incorporated herein by reference in its entirety. This application claims the benefit of U.S. Provisional Patent Application No. 63/037,100, filed Jun. 10, 2020, which is incorporated herein by reference in its entirety.

FIELD

Embodiments of methods and apparatuses and systems are described for plasma ashing.

BACKGROUND

Coating devices for protection from ambient conditions is common in certain industries such as computer electronics. For example, applying a thin coating such as Parylene to an electronic component can provide protection from water, dust, and other corrosive substances or harmful conditions. The coating is often done by chemical vapor deposition. However, many components need certain surfaces or areas to be coating-free. These may include electrical connections or contact points. Conventionally, the areas that are desired to be coating free are masked with a paper or other material that is roughly the shape of the area and then the masking material is taped or otherwise adhered to the component. This process is not without its complexities and problems.

Often, many parts of a single surface need to be coating free. This may involve multiple applications of masking materials to the component or part, which takes time and costs money. Each individual masking of each surface of the component or item would then be removed, costing additional time and money. In some cases, the coating needs to be removed. The masking material may be adhered so well to the item or component that it may require complex processes to remove the masking material and/or residual adhesion materials. The coating may damage the masking material or otherwise render the masking material unsuitable for further use. Often the masking material is ruined by the removal process, which also renders the making material unsuitable for further use.

One obvious downside of single-use masking material is that it uses additional time and material costs to coat single items that require multiple coatings. Further, a coating machine may only fit a finite number of parts and if there are more than this number of items to be coated, single-use masking materials and processes may prove inefficient, further increasing time and material expense. Additionally, having to individually mask various areas of a single surface may render batch processes or process automation impossible. Other processes for removing coatings are needed.

Embodiments of the present invention address these and other problems with current coating processes. Plasma ashing may be used to remove coatings from unwanted areas. And improving ashing rates reduces processing time and saves money. Some embodiments utilize UV pretreatment prior to plasma ashing.

SUMMARY

The subject matter of the present application has been developed in response to the present state of the art, and in particular, in response to the problems and disadvantages associated with conventional coating removal systems that have not yet been fully solved by currently available techniques. Accordingly, the subject matter of the present application has been developed to provide embodiments that overcome at least some of the shortcomings of prior art techniques.

Disclosed herein is a plasma ashing system. The plasma ashing system includes a plasma generator configured to generate a plasma from a gas source. The system further includes a plasma reaction chamber configured to house a substrate comprising a Parylene coating, wherein the plasma reaction chamber is configured to expose surfaces of the Parylene coating on the substrate to the plasma, wherein the plasma is configured to remove portions of the Parylene coating on the substrate. The preceding subject matter of this paragraph characterizes example 1 of the present disclosure.

The system further includes a UV pretreatment system, wherein the UV pretreatment system is configured to apply UV radiation to the surfaces of the Parylene coating on the substrate prior to exposing the surfaces of the Parylene coating to the plasma. The preceding subject matter of this paragraph characterizes example 2 of the present disclosure, wherein example 2 also includes the subject matter according to example 1, above.

The gas source comprises an argon-, oxygen-, hydrogen-, or a nitrogen-containing gas, or a fluorocarbon gas, or a combination thereof. The preceding subject matter of this paragraph characterizes example 3 of the present disclosure, wherein example 3 also includes the subject matter according to any one of examples 1-2, above.

The system further includes a masking fixture configured to shield areas of the substrate from plasma ashing. The preceding subject matter of this paragraph characterizes example 4 of the present disclosure, wherein example 4 also includes the subject matter according to any one of examples 1-3, above.

The plasma is configured to heat the plasma reaction chamber. The preceding subject matter of this paragraph characterizes example 5 of the present disclosure, wherein example 5 also includes the subject matter according to any one of examples 1-4, above.

The plasma is generated in a plasma generation chamber separate from the plasma reaction chamber. The preceding subject matter of this paragraph characterizes example 6 of the present disclosure, wherein example 6 also includes the subject matter according to any one of examples 1-5, above.

The system further includes at least one sensor in the plasma reaction chamber, the at least one sensor configured to determine a stop time for the exposure, wherein the stop time is generated utilizing at least one factor of a plurality of factors, the plurality of factors including a coating depth, a reaction time, a process time, an application time, a gas output, an energy output, an ambient temperature, an electron temperature, a material temperature, a pressure, a plasma composition, a material composition, an ash or particle composition, an ash or particle amount, or an ash rate. The preceding subject matter of this paragraph characterizes example 7 of the present disclosure, wherein example 7 also includes the subject matter according to any one of examples 1-6, above.

The system further includes a masking fixture configured to shield areas of the substrate from plasma ashing, wherein the masking fixture is made of a material configured to withstand a temperature of up to 400° C., and wherein the masking fixture is configured to be reusable. The preceding subject matter of this paragraph characterizes example 8 of the present disclosure, wherein example 8 also includes the subject matter according to any one of examples 1-7, above.

The system further includes a control processor, wherein the control processor is configured to control a residence time and an ash rate for applying the plasma. The preceding subject matter of this paragraph characterizes example 9 of the present disclosure, wherein example 9 also includes the subject matter according to any one of examples 1-8, above.

The plasma reaction chamber is configured to remove only a selected portion of the Parylene coating on the substrate by applying a plasma to the selected portion of the Parylene coating. The preceding subject matter of this paragraph characterizes example 10 of the present disclosure, wherein example 10 also includes the subject matter according to any one of examples 1-9, above.

Disclosed herein is a plasma ashing system. The plasma ashing system includes a UV pretreatment system, wherein the UV pretreatment system is configured to apply UV radiation to surfaces of a Parylene coating on a substrate. The system includes a plasma generator configured to generate a plasma from a gas source. The system further includes a plasma reaction chamber configured to house a substrate comprising a Parylene coating, wherein the plasma reaction chamber is configured to expose surfaces of the Parylene coating on the substrate to the plasma, wherein the plasma is configured to remove portions of the Parylene coating on the substrate. The preceding subject matter of this paragraph characterizes example 11 of the present disclosure.

The plasma is generated in a plasma generation chamber separate from the plasma reaction chamber. The preceding subject matter of this paragraph characterizes example 12 of the present disclosure, wherein example 12 also includes the subject matter according to example 11, above.

Disclosed herein is a method. The method includes generating a plasma from a gas source, wherein the plasma is generated by a plasma generator. The method includes inserting a substrate comprising a Parylene coating into a plasma reaction chamber. The method includes exposing, within the plasma reaction chamber, portions of a surface of the Parylene coating to the plasma, wherein the plasma is configured to remove the portions of the Parylene coating on the substrate. The preceding subject matter of this paragraph characterizes example 13 of the present disclosure.

The method includes applying a UV pretreatment process to the surfaces of the Parylene coating on the substrate prior to exposing the surfaces of the Parylene coating to the plasma. The preceding subject matter of this paragraph characterizes example 14 of the present disclosure, wherein example 14 also includes the subject matter according to example 13, above.

The UV pretreatment process comprises directing UV radiation at the exposed surfaces of the Parylene coating on the substrate. The preceding subject matter of this paragraph characterizes example 15 of the present disclosure, wherein example 15 also includes the subject matter according to any one of examples 13-14, above.

The method includes utilizing the plasma to heat the plasma reaction chamber during the exposure of the surfaces of the Parylene coating on the substrate. The preceding subject matter of this paragraph characterizes example 16 of the present disclosure, wherein example 16 also includes the subject matter according to any one of examples 13-15, above.

The plasma is generated in the plasma reaction chamber. The preceding subject matter of this paragraph characterizes example 17 of the present disclosure, wherein example 17 also includes the subject matter according to any one of examples 13-16, above.

The plasma is generated in a plasma generation chamber separate from the plasma reaction chamber. The preceding subject matter of this paragraph characterizes example 18 of the present disclosure, wherein example 18 also includes the subject matter according to any one of examples 13-17, above.

The method includes applying a mask to the substrate, wherein the mask is configured to shield portions of the coating on the substrate and leave exposed portions of the coating on the substrate. The preceding subject matter of this paragraph characterizes example 19 of the present disclosure, wherein example 19 also includes the subject matter according to any one of examples 13-18, above.

The method includes determining a stop time for the exposure, wherein the stop time is generated utilizing at least one factor of a plurality of factors, the plurality of factors including a coating depth, a reaction time, a process time, an application time, a gas output, an energy output, an ambient temperature, an electron temperature, a material temperature, a pressure, a plasma composition, a material composition, an ash or particle composition, an ash or particle amount, or an ash rate. The preceding subject matter of this paragraph characterizes example 20 of the present disclosure, wherein example 19 also includes the subject matter according to any one of examples 13-19, above.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
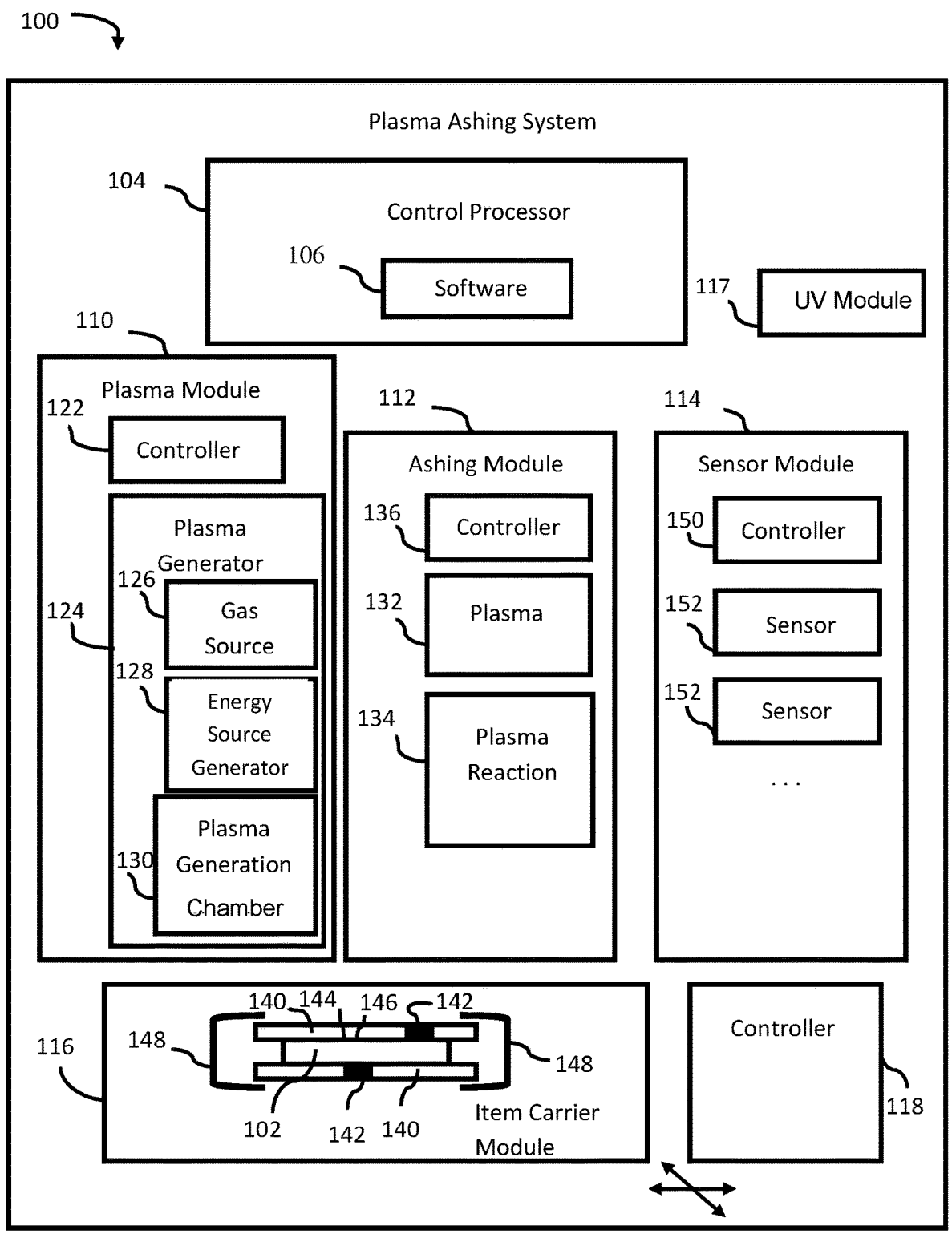
FIG. 1 depicts a schematic diagram of a plasma ashing system in accordance with one or more embodiments of the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

In some embodiments, the term "coating", used herein as a noun includes and is interchangeable with the terms, "treatment", "residue", "film", "lamination", "layer", "veneer", "plating", "overlay", and any other application of one substance or material to another. A "coating" may be made of organic and inorganic materials and specifically includes polymers and other protective coatings. In some embodiments, the term "coating" may refer to a Parylene coating.

The expression "configured to" as used herein may be used interchangeably with "suitable for," "having the capacity to," "designed to," "adapted to," "made to," or "capable of" according to a context. The term "configured" does not necessarily mean "specifically designed to" in a hardware level. Instead, the expression "apparatus configured to . . . " may mean that the apparatus is "capable of . . . " along with other devices or parts in a certain context.

The term "selectively coating" or "selectively coated" as used herein throughout with regard to a part, component, device, and the like, means completely or partially coating the part, component, device, and the like. This term also includes completely or partially coating the part, component, device, and the like, and then removing at least a portion of the coating. Additionally, items subjected to a "selective coating" or that have been "selectively coated" have a "selective coating" or a "selective coat." Furthermore, the term "selective coating" has a similar meaning and can similarly be used as a noun or a verb. For purposes of clarification only, a part, component, device, and the like that has been completely or partially coated, and then had at least some of that coating removed through a plasma ashing process or other process has a "selective coat", has been "selectively coated", or has been through the process of "selective coating."

The terms "part", "component", "device", or "item" may be used interchangeably. These terms are meant to include substrates, printed circuit boards and any other item that is or can be coated.

While many embodiments are described herein, at least some of the described embodiments facilitate improved application and/or avoidance of thin-film coatings on sensitive electronic devices such as circuit boards and similar devices. One example of a use case for embodiments of the present invention includes printed circuit boards for electronic devices. These are coated with a polymer or other protective coating. One class of coating material that has proven well suited to chemical vapor deposition on a part such as a printed circuit board is Parylene. Parylene offers good waterproof and other protection qualities. But printed circuit boards, like many coated parts, need portions that are coating free, such as electrical or other connections, bore to bore connectors, micro USBs, and the like.

Within the context of these constraints, improved coating and coating avoidance or coating removal techniques are needed to perform selective coating of substrates or other parts in and efficient manner, capable of mass processing, and with little waste of material or processing time. Embodiments of the present invention solves these problems and others by utilizing a plasma ashing process in combination with a reusable mask, to remove coating material from predetermined areas of the coated part or device. Such a process may be performed after the coating and standard masking materials and processes are not necessarily used, in some embodiments, thus making the overall process more efficient with less time and material waste. In addition, some embodiments include applying a UV pretreatment as part of a removal process.

FIG. 1 depicts a schematic diagram of one embodiment of a plasma ashing system 100. The illustrated plasma ashing system 100 is generally configured to remove coatings from a part or component 102. The device 102 may be any type of printed circuit board or other part or component 102 that needs a selective coating. Although the plasma ashing system 100 is shown and described with certain components, modules and functionality, other embodiments of the plasma ashing system 100 may include fewer or more components or modules to implement less or more functionality.

The illustrated plasma ashing system 100 includes a control processor 104. The control processor 104 is generally configured to control operations of the plasma ashing system 100, either alone or in conjunction with various processing sub-systems integrated into other systems or modules within the plasma ashing system 100. For example, the control processor 104 might communicate electronically with a plasma module 110, an ashing module 112, a sensor module 114, a UV module 117, and an item carrier module 116, as well as other any other systems or modules included in various embodiments of the plasma ashing system 100.

The control processor 104 also includes software 106, in some embodiments, stored on any form of computer readable medium and accessible for execution by the control processor 104. The exact form or format of the software is not constrained other than to be capable of performing the functions described herein and related functions within the scope of similar devices. In particular, the software may be capable of carrying out part or all of the functionality described in any methods, steps, processes, or other functional descriptions of the plasma ashing system 100 and its component sub-systems.

In one embodiment, the plasma module 110 is configured to generate plasma suitable for ashing and includes a controller 122 and a plasma generator 124. The plasma generator 124 may include gas source 126 and an energy source 128. In one embodiment, the plasma used for ashing in the plasma ashing system 100 is derived from or contains oxygen. In other embodiments, the gas source 126 provides gas or gases that produce oxygen-free plasma. These may be generated using a hydrogen- or nitrogen-containing gas. In other embodiments helium, argon, or other noble gases may be used to produce the plasma used in the plasma ashing system 100. In another embodiment, the gas source 126 supplies fluorine, chlorine, or other halogens to make plasma. The gas source 126 may provide these or other gases alone or in combination. The gas source 126 may supply gases with varying levels of purity. The gas source may provide gases in combination with non-gas species such as boron, bromine, carbon, sulfur, or other solids or liquids. In one embodiment, the gas source provides one or more of $CF_4$, $CHF_3$, $C_3F_6$, $C_4F_8$, $SF_6$, and HBr as the source of plasma.

The energy source 128 is configured to provide and apply energy to the gas or gasses supplied by the gas source 126 such that the gas or gasses become at least partially ionized. In one embodiment, the energy source 128 includes direct current. In this embodiment, gas is subjected to an electrical field across the cathode and anode connected by the direct current electric source. In another embodiment, the energy source 128 includes a radio frequency discharge. The energy source 128 may be configured to inductively or capacitively couple energy at a frequency range that is at or below the radio spectrum. An RF power supply may be used to ionize gas from the gas source 126 by creating energy at frequencies between about 1 kHz to about 103 MHz. The energy source 128 may create an inductively coupled discharge or a capacitively coupled discharge to ionize gas from the gas source 126. In another embodiment, the energy source 128 includes a microwave discharger or generator. In this embodiment, the microwave generator creates electromagnetic radiation having a frequency of at least 1 GHz. In other embodiments, the microwave generator creates high frequency electromagnetic radiation, or microwaves of about 2.45 GHz to ionize gas from the gas source 126. Indeed, the energy source may be a heat generator or an electromagnetic filed generator that ionizes a gas or makes a gas more electrically conductive.

The energy source 128 may apply energy to the gas in a variety of ways including without limitation, with a constant or varying degree of intensity, at a constant or varying rate, or for a constant or varying lengths of time.

The plasma generator 124 creates plasma by applying energy from the energy source 128 to at least partially ionize gas from the gas source 126. The application of energy to gas may occur in plasma generation chamber 130. The plasma generator 124 may include other components such as heating or cooling systems to control the temperature of the plasma generation process and electrodes. The plasma generator 124 may also include pumps, pressure regulators and the like to control the pressure during t plasma generation process.

The particular application of energy to gas in a particular environment of heat, pressure, or other conditions may allow a user to create a customizable plasma that can have varying degrees of ionization with a variety of chemical compositions or other characteristics. A customized plasma may be used to create a customizable plasma ashing process suitable for a variety of desired ashing applications.

The plasma module 110 may also include a controller 122 for executing instructions or software to control various aspects of the plasma generator functions. These functions may include, without limitation, gas flows, power flows, energy applications, temperature regulation, pressure regulation and the like. The controller 122 may be any type of compatible controller. Some examples of potentially compatible controllers 122 include, but are not limited to, constant current drivers, pulsing drivers, low power drivers, high power drivers, and similar controllers. In some embodiments, the controller 122 may have various subsystems or sub circuits that individually control the various properties of the plasma generator. In some embodiments, the controller 122 electronically communicates with the control processor 104. In some embodiments, the controller 122 electronically communicates with the ashing module 112, the sensor module 114 and/or the item carrier module 116. Such communication may be directly to the ashing module 114, the sensor module 116 and/or the item carrier module 116, or via the control processor 104.

The plasma module 110 may include, in some embodiments, a UV module 117. In some embodiments, the UV module 117 may be separate from the plasma module. The UV module 117 may include a UV source configured to generate ultraviolet radiation. In some embodiments, the UV generated is targeted in specific locations. In other embodiments, the UV is targeted in general locations. This may be done using a targeted and localized UV source or through a general UV source with a shield, template, or mask covering the substrate or component.

The ultraviolent radiation may degrade the Parylene coating prior to plasma ashing at selected areas. Exposing the areas of a component where it is desired to remove Parylene or other coating by plasma ashing with UV pretreatment allows for easier and faster removal of the Parylene or other coating during the plasma ashing process.

In order to selectively remove Parylene or other coating during the plasma ashing process, the component may be placed in a fixture that shields all areas where Parylene will remain. In some embodiments, the fixture is a masking fixture with holes or apertures and gaskets. The gaskets or gasketing may provide a seal or cushioned application of the fixture to the component that is configured to restrict UV exposure to parts covered by the fixture but also protect coating from physical damage of the fixture on the coating. In some embodiments, the fixture is may be made of a material that is able to withstand UV and potentially high temperatures up to 425° F. and have a high level of electrical insulation. In some embodiments, the fixture is made of a silicone resin with a fiberglass fabric reinforcement, such as a silicone-grade laminate or phenolic. In some embodiments, the gasketing is a silicone rubber material. Other embodiments utilize other materials and types of fixtures.

In some embodiments, the components are put in the fixtures and are placed in a UV system. The UV treatment process may run for a period of time to degrade the coating. In some embodiments, the UV treatment process is run for more than 30 minutes and for less than 48 hours. The length of time may vary based on the UV intensity, coating material, thickness, and other specifications. In some embodiments, the UV treatment process is run at a temperature of less than 85° C. The temperature may depend on the specifications of the component and what temperature is permissible for a particular component such as a circuit board etc.

As discussed previously, the UV module 117 may be part of the plasma module 110 or may be a separate module. In some embodiments, the UV system is separate from the plasma ashing system 100. In some embodiments, the UV system is part of the plasma ashing system 100.

The UV module 117 is configured to increase plasma ashing rates and thus reduce the time required for plasma ashing. In some embodiments, typical ash rates are between 0.5 μm/min and 1.2 μm/min. In some embodiments, typical ash rates are between 0.02 μm/min and 2.0 μm/min. In some embodiments, UV exposure has shown to increase ash rates by up to and beyond 50%.

The ashing module 112 may include a plasma applicator 132 in operable communication with a plasma reaction chamber 134. The plasma reaction chamber 134 is in fluid communication with the plasma generator 124. Once the plasma is generated, it may be introduced into the plasma reaction chamber 134. In one embodiment, the plasma is discharged from a plasma-generation chamber 130 through an opening or openings (not shown) into the plasma reaction chamber 134. In one embodiment, the openings are configured to increase the pressure in the plasma generation chamber 130, thus creating a pressure differential between the plasma generation chamber 130 and the plasma reaction chamber 134. In one embodiment, one or more of the plasma generator 124, the plasma generation chamber 130, and the plasma reaction chamber 134 includes a pressure regulator. In other embodiments, the openings or conduits between the plasma generator 124, the plasma generation chamber 130 and/or the plasma reaction chamber 134 are used to control or regulate pressure. Although described with various chambers, the plasma may be generated within any of the individual chamber above or in single chamber where all processes described herein take place.

The plasma reaction chamber 134 in conjunction with the plasma applicator 132 are configured to allow plasma to react to exposed surfaces of item to remove coatings, from surfaces exposed to the plasma. The plasma reaction chamber 134 and/or the plasma applicator 132 may also be configured to facilitate the removal of desired material without significant loss or modification of any underlying materials, such as a substrate or printed circuit board. In one embodiment the plasma applicator 132 is configured to provide a uniform an even application of plasma to all sides of the item to be ashed simultaneously.

The plasma reaction chamber 134 may include other components such as heating or cooling systems to control the temperature of the plasma reaction process. In one embodiment, the plasma reaction chamber 134 is configured to directly or indirectly heat the item or coating to be plasma ashed to at least 200° C. to increase plasma reactivity. In another embodiment, the plasma reaction chamber 134 is configured to heat to provide heat between about 10 to 385° C. directly or indirectly to the item or coating to be plasma ashed. In another embodiment, the plasma reaction chamber 134 may be configured to operate at a temperature between about 30 and about 100° C.

The plasma reaction chamber 134 may also include pumps, pressure regulators and the like to control the pressure during the plasma ashing process. In one embodiment, the plasma reaction chamber 134 is configured to reduce the pressure within the plasma reaction chamber 134 to optimize plasma residence time to increase the reaction rate between the plasma and the material or coating to be removed from an item in the plasma reaction chamber 134. Pumps and other devices may be used to purge or remove byproducts of the ashing process, such as carbon oxides, ash, water vapor, and the like.

The ashing module 110 may also include a controller 136 for executing instructions or software to control various aspects of the plasma generator functions. These functions may include, without limitation, gas flows, power flows, energy applications, temperature regulation, pressure regulation and the like. The controller 136 may be any type of compatible controller. Some examples of potentially compatible controllers 136 include, but are not limited to, constant current drivers, pulsing drivers, low power drivers, high power drivers, and similar controllers. In some embodiments, the controller 136 may have various subsystems or sub circuits that individually control the various properties of the plasma applicator 132, the plasma reaction chamber 134, or plasma reactions within the plasma reaction chamber 134. In some embodiments, the controller 136 electronically communicates with the control processor 104. In some embodiments, the controller 136 electronically communicates with the plasma module 110, the sensor module 114 and/or the item carrier module 116. Such communication may be directly to the plasma module 110, the sensor module 114 and/or the item carrier module 116, or via the control processor 104.

In one embodiment, plasma may be generated directly in the plasma reaction chamber 134 instead of in a separate plasma generation chamber 130. In this embodiment, some or all of the functionality of the plasma generation module 110 and the ashing module 112 are shared in a single module. In this embodiment, the coated item to be plasma ashed may be positioned between electrodes within a combined plasma generation/plasma reaction chamber not shown. As gas comes into an energy field created between the electrodes, plasma forms around the item 102.

In some embodiments, the plasma ashing system 100 includes an item carrier module 116. The item carrier module 116 may include an item carrier or holder (not shown) configured to secure, hold, locate, and move an item within the plasma reaction chamber 134. This allows the item to be optimally positioned within the plasma reaction chamber 134 to achieve optimal plasma aching results. The item carrier may include physical features that secure the electronic device 102 in a specific location on the item carrier and in a specific orientation on the item carrier. The item carrier may be configured to hold a single item 102 or multiple items 102 within the plasma reaction chamber 134.

In one embodiment, the item carrier includes a mask 140, configured with at least one opening 142. The mask 140 may be configured with at least one inner surface 144 conforming to an outer surface 146 of an item 102 to be plasma ashed. In one embodiment, the mask 140 is configured to encase the item 102, or otherwise prevent the item 102 from being exposed to the plasma, except through the one or more openings 142 in the mask 140. In certain embodiments, the carrier 116 may be configured to allow multiple masks 140 to substantially cover or surround an item 102 by attaching the masks together or to the item 102 with a coupling 148. In one embodiment the coupling 148 may be a mechanical device, including a clip, clamp, a strap, a rivet, a screw, a bolt, and the like. In another embodiment, the coupling 148 may be a glue or a seal, or a chemical process. The coupling 148 may be magnetic. It will be appreciated by those of skill in the art that the coupling 148 may any of a number of ways known in the art to attach one item to another.

The mask 140 may be part of the item carrier (not shown) or it may be a standalone unit that is not part of the item carrier. As a standalone unit, the mask 140 may be placed on or manipulated by the item carrier (not shown) as an item 102 would be.

In some embodiments, the plasma ashing system 100 includes a carrier controller 118. The carrier controller 118 is generally configured to control the functions and processes of the item carrier module 116, including movement and placement of the item carrier within the plasma ashing system 100. The carrier controller 118 is further configured to locate the masked item or items 102 in a position to be plasma ashed by the ashing module 110. The carrier controller 118 may be of a type described above and may communicate directly with the controllers of other modules with the plasma ashing system 100 or indirectly by way of the control processor 104.

The plasma ashing system 100 may include a sensor module 114 having a controller 150 and one or more sensors 152. The sensors 152 may sense a progression or stage of the ashing process. The sensors 152 and/or sensor module 114 may be in operable communication with the ashing module 112, the plasma module 110, the item carrier module 116 and/or the control processor 106 to allow the system 100 and/or one or more of the modules 110, 112 and 116 to use data from the sensors 152 to perform or modify various functions or processes. By way of non-limiting example, the sensor module 114 may determine when a certain amount of coating has been removed from an item and the ashing module 112 may use that information to stop the ashing process.

Sensors 152 may be configured to sense or measure any number of factors, including without limitation, a coating depth, a reaction time, a process time, an application time, a gas output, an energy output, an ambient temperature, an electron temperature, a material temperature, a pressure, a plasma composition, a material composition, an ash or particle composition, an ash or particle amount, an ash rate, an amount of material, an amount of plasma, a plasma density, plasma ion level, an energy level, an energy distribution, an energy field, a fluorescence, a polarization, a differential, a ratio, a change or shift in any of the forgoing and more.

These sensors 152 may include without limitation, optical sensors, particle sensors, spectrometers, thermometers, pressure gages, timing devices, probes, gauges, micrometers, mass analyzers and the like.

Sensors 152 may be located along any part of the process. In one embodiment, at least one sensor 152 is located within at least one the gas source 126, the energy source 128, the plasma generation chamber 130 and the plasma reaction chamber. In another embodiment, at least one sensor 152 is located at or near an item 102. In one embodiment, a sensor 152 may be attached to the part 102 during all or a portion of the plasma ashing process.

The controller 150 of the sensor module 114 may execute instructions or software to control various aspects or functions of the sensor module 114. These functions may include, without limitation, sensor function, sensor data input and output, data processing and the like. In one embodiment, the controller 150 may apply an algorithm to data inputs received from one or more sensors 152 to produce an output used by one or more modules or components of the plasma ashing system 100 to control various aspects or functions or the plasma ashing system 100. The controller 150 may be any type of compatible controller. Some examples of potentially compatible controllers 150 include, but are not limited to, constant current drivers, pulsing drivers, low power drivers, high power drivers, and similar controllers. In some embodiments, the controller 150 may have various subsystems or sub circuits that individually control the various properties of the sensors. In some embodiments, the controller 150 electronically communicates with the control processor 104. In some embodiments, the controller 150 electronically communicates with the ashing module 112, the plasma module 110 and/or the item carrier module 116. Such communication may be directly to the plasma module 110, the ashing module 112, and/or the item carrier 116, or via the control processor 104.

Figure 2A:
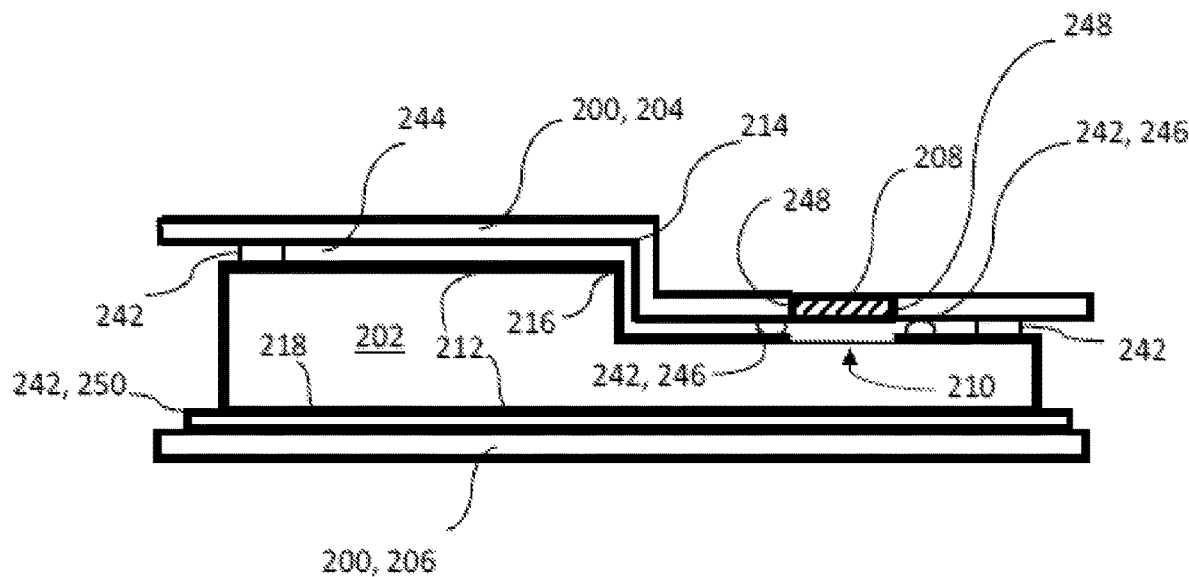
FIG. 2A depicts a plan view of an embodiment of a mask and an item for use in a plasma ashing system in accordance with one or more embodiments of the present invention.

Turning now to FIG. 2A, a perspective view of a mask 200 according to one or more embodiments is shown. The mask 200 may be applied to an item 202. In one embodiment, the mask 200 is a 2-part component having a first piece 204 and a second piece 206 that are connected by a coupling (not shown). At least one of the first piece 204 and second piece 206 has an opening 208 to allow exposure to a portion 210 of the item 202. This allows plasma within a plasma ashing system to react with the portion 210 of the item 202 causing removal of material from the portion 210 of the item 202.

In some embodiments, the mask may be a single unitary piece that is coupled to the item 202. In other embodiments, the mask may be three or more pieces used to completely surround, or substantially surround the item 202, or a surface 212 of the item 202. One or more openings 208 may be in any one piece of the mask 200 or in multiple pieces of the mask 200. Accordingly, substantially all of coated item 202 or coated surface 212 of an item 202 can be coated, and then a coating on a predetermined portion 210 of the item 202 or item surface can be removed by plasma ashing through the opening 208 or openings in the mask 200.

In one embodiment, the mask 200 or portion of the mask may have at least one surface 214 that is configured to match and/or substantially conform to the profile or contours of at least a portion of a surface 212 of the item 202. In one embodiment, where the mask includes multiple pieces, one piece 204 of the mask 200 may have a surface 214 that is configured to match and/or substantially conform to the profile or contours of at least a portion of a surface 216 of the item 202, while one or more of the other pieces (as discussed below) of the mask may not match or substantially conform to the profile or contours of a surface 218 of the item 202.

In one embodiment, the contouring of a surface of a mask or piece of a mask is accomplished by 3D profiling. Contouring of a surface of a mask may minimize or reduce the aspect ratio of the openings and help maximize paging density of masked items within a plasma reaction chamber. It will be appreciated that there are many ways to configure a mask surface to closely match the surface of an item to be plasma ashed. Similarly, there are many ways to create desired openings in the mask to allow areas of the item 202 to be exposed to the plasma.

The mask 200 may be made of material that is sufficiently strong to hold the item in place and maintain a sufficient enclosure or covering of the item throughout the plasma ashing process. The mask 200 may be of a material that is easy to machine, work and process; that allows for making walls, peaks and valleys of substantially uniform thickness. The mask 200 may be made of material that retains its dimensional stability or flatness through increased temperature and/or pressure that may occur during the plasma ashing process. The mask 200 material may be chosen because it is substantially inert to plasma reactions. The material for making the mask 200 may be chosen for its antistatic, electrical, thermal and chemical properties. The proper mask 200 material allows a mask to be created, used and reused to limit coating removal to predetermined desired areas of the coated item.

In one embodiment, the mask 200 may be made of aluminum. In other embodiments, the mask 200 may be made of glass. In one embodiment, the mask 200 is made of a fiber glass cloth reinforced with resin. The mask 200 may be made of resins, epoxies, composite polymers, and the like and one or more of these may be combined with other materials to create the mask 200. In one embodiment, the mask 200 is made of heavy-duty glass fiber reinforced plastic. The mask 200 in another embodiment is made of ricocel. In yet another embodiment, the mask 200 is made of risholite. The mask may also be made of one or more of Durastone, Durapol, Mycalex, ceramics, and the like. The foregoing and other materials, may be combined as laminates into the mask 200. It will be appreciated that there are a number of ways to form these and other materials into a mask 200.

In one embodiment, the mask 200 can withstand temperatures up to 400° C. In some embodiments, withstand may mean that the mask 200 remains robust with only minor changes to shape and dimensions throughout processing. In another embodiment, the mask 200 has a thermal rating between 100 and 385° C. In other embodiment, the mask 200 is configured to be operable in temperatures between about 220 and about 300° C.

In one embodiment, the mask 200 has areas with thickness less than about 0.5 mm. In other embodiments, the mask 200 has a substantially uniform thickness of between about 0.2 and about 1 mm.

The mask 200 may include a spacer 242 that separates the mask 200 from the item 202. The spacer 242 may be made of a softer material than the mask 200 to help keep the mask 200 from scratching or otherwise altering the item 202 or a coating on the item 202. The spacer 242 may be part of the mask 200 or a separate piece. The spacer 242 may create a void 244 between the mask 200 and the item 202. The spacer may be a layer 250 of material that serves as a protective layer between the mask 200 and the item 202 or a coating on the item 202 and may substantially cover the item 202 or a coating on the item 202. The spacer 242 may be a caulk or bead of material 246 connecting an edge 248 or edges of the mask 200 to the item 202. In this configuration, the spacer 202 may function more as a seal.

In one embodiment the spacer 242 may be a photopolymer, a fluoropolymer or other type of polymer. In other embodiments, ricocel or similar types of material may serve as the spacer 242. The spacer may also be used to hold an item such as a printed circuit board within the mask 200.

It will be appreciated by those of skill in the art, that some spacer 242 materials may add unwanted impurities to the ashing process which may cause run-to-run variations with the ashing process or variations between different machines used for the same ashing process. Additionally, some spacer 242 materials may release a gas during the ashing process which may negatively affect process times or pump times under certain conditions. In one embodiment, the spacer 242 may be made of low outgas sing material to allow for greater consistency of the ashing process, including ashing rates, or reduced condensation that may adversely affect the item 202 or any sensors (not shown).

A reusable mask that can withstand the plasma ashing environment allows the mask to be used and reused after the coating process, which significantly reduces the amount of wasted time and material that occurs when having to mask and demask and item 202 prior to coating the item 202. These pre coating masking steps typically also require an additional material or coating removal step as part of cleanup process for the item. The processes and apparatuses of the present invention may also facilitate a more efficient large-scale coating process.

In some embodiments, the mask utilized for the plasma ashing process is also used for the UV treatment process. The mask may be kept on the component as it is transferred from the UV treatment process to the plasma ashing process.

Figure 2B:
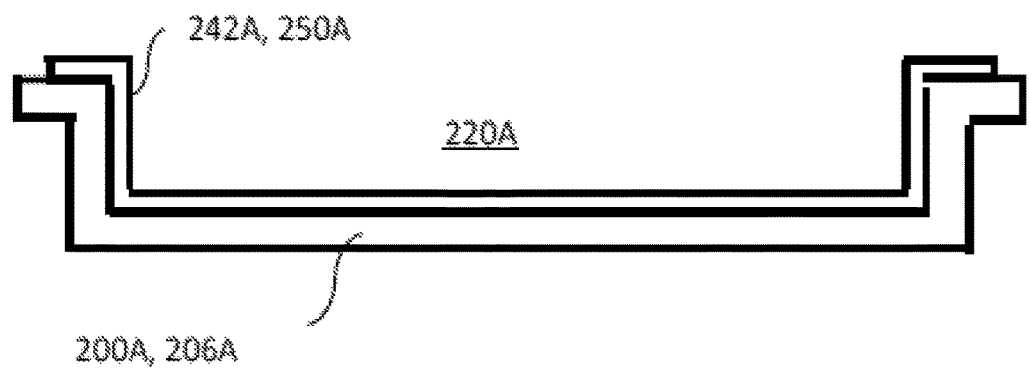
FIG. 2B depicts a plan view of an alternate embodiment of a portion of mask for use in a plasma ashing system in accordance with one or more embodiments of the present invention.

FIG. 2B depicts a plan view of an alternative to mask piece 200, 206 of FIG. 2A. The alternative piece 200A, 206A may not have any openings and may not need to conform to a surface or area of coated item. In this configuration, the mask piece 200A, 206A defines a space 220A when attached to an item or to another mask piece about an item. Accordingly, this piece 200A, 206A may be configured to eliminate exposure of the item or a portion of the item to the plasma, but may do so without needed to conform or match the contour of an adjacent surface of the item. Thus a user may use be able to save the cost of contouring this piece 200A, 206A, in a detailed manner and may also be able to use the piece 200A, 206A with a number of differently contoured items that would fit within the space 220A.

Figure 3:
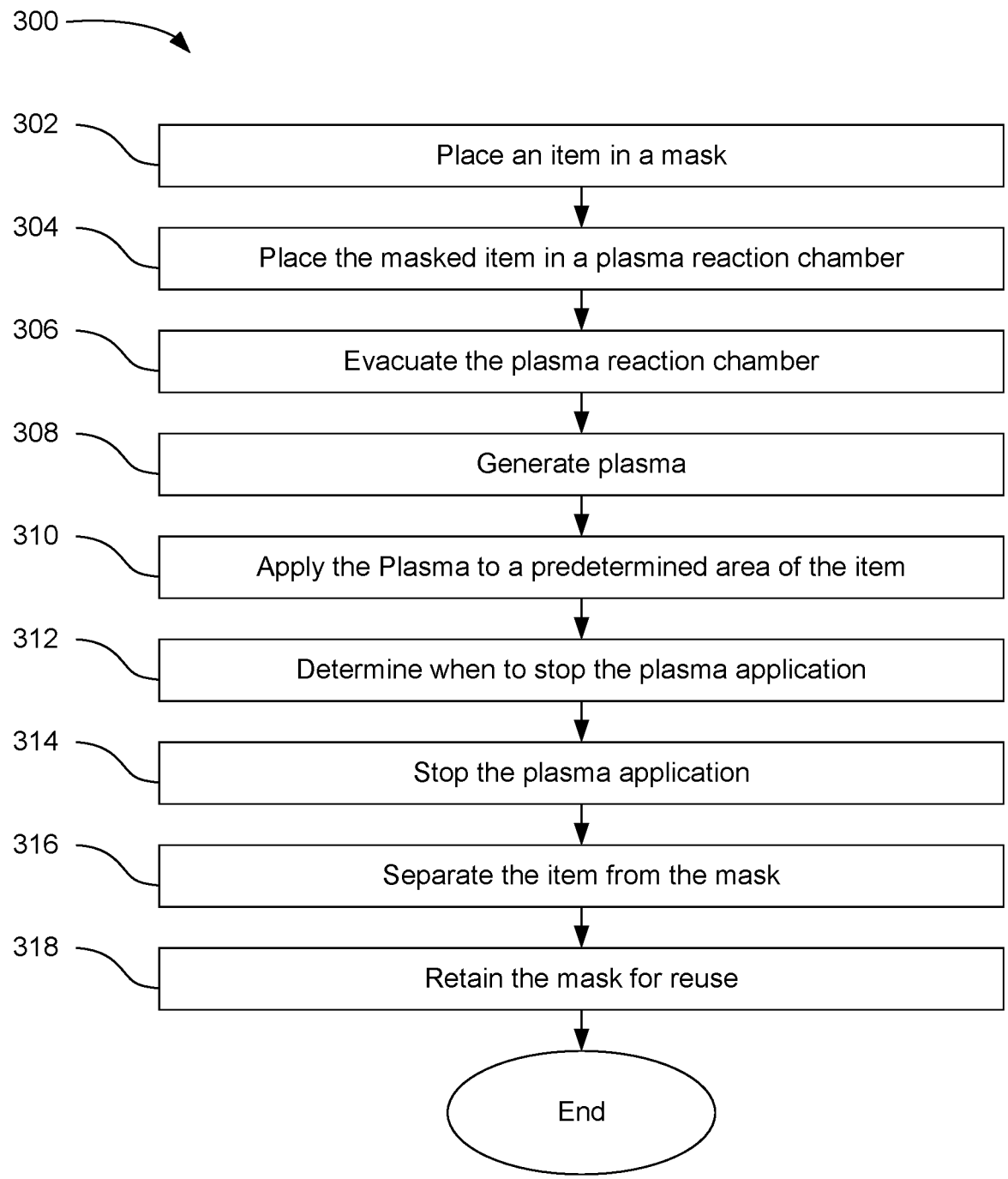
FIG. 3 depicts a flow chart diagram of a plasma ashing method for implementation with one or more of the plasma ashing systems in accordance with one or more embodiments of the present inventions.

FIG. 3 depicts a flow chart diagram of a plasma ashing method 300 for implementation with one or more of the plasma ashing systems described and shown herein. Although the method 300 is described in conjunction with the plasma ashing system of FIG. 1, embodiments of the method 300 may be implemented with other types of plasma ashing systems.

In one embodiment, the plasma ashing method 300 includes the step of placing 302 an item in a mask. The mask may be of a kind described above. In one embodiment, the item is a printed circuit board coated with Parylene. The mask in this embodiment includes a first piece having a surface configured to substantially match the contour or profile of a first side or surface of the printed circuit board. The first piece may be configured with one or more openings. The printed circuit board is placed 302 in the mask such that the one or more openings in the first piece of the mask corresponds with and is adjacent to areas of the printed circuit board where it is desired to exposed the area or areas to plasma and remove the coating on the area or areas by plasma ashing. The mask may include a second piece having a surface configured to substantially match the profile or contour of a second side of surface of the printed circuit board. The second piece may also be configured with one or more openings and the printed circuit board may be placed 302 in the mask such that the one or more openings in the second piece corresponding and adjacent to areas of the printed circuit board having coatings that are desired to be exposed to plasma and removed by the plasma ashing process. In one embodiment, the step of placing an item in the mask include securing the first and second piece of the mask about the printed circuit board with a clip, magnet, or other coupling.

In another embodiment, the step of placing 302 an item in a mask includes placing one or more spacers in between the item and at least a portion of the mask. In one embodiment, placing an item in the mask includes placing a gasket or gasket material having low outgassing properties between at least a portion of the item and a portion of the mask. In one embodiment, the mask is made of aluminum and the gasket material is ricocel.

The method 300 may include the step of placing 304 the masked item in the plasma reaction chamber. In one embodiment, the masked item is placed within in the plasma reaction chamber by itself. In another embodiment, the masked item is placed on an item carrier or holder. This may be a specially designed fixture to hold the masked item. In yet another embodiment, the masked item may be placed on a tray or other container or systems of fixtures with multiple masked items. Placing 304 the masked item in the plasma reaction chamber may include placing multiple masked items in the chamber. The carrier in one embodiment is fixed within the plasma reaction chamber. In another embodiment, the carrier is movable within the plasma reaction chamber to facilitate the ideal positioning of the masked item within the plasma chamber. The movable carrier may also facilitate entry and exit of the masked item into and out of the plasma reaction chamber. Placing 304 the masked item in the plasma reaction chamber may include placing the masked item on a carrier and then moving the carrier to a desired position within the plasma reaction chamber.

The method 300 may include the step of evacuating 306 the plasma reaction chamber. Evacuating the plasma reaction chamber includes removing gasses, vapors, solids and liquids from within the plasma reaction chamber. Evacuating the plasma reaction chamber may include removing particles or impurities. In one embodiment, the step of evacuating 306 the plasma reaction chamber includes creating a vacuum or partial vacuum within the plasma reaction chamber.

In one embodiment, the step of evacuating 306 the plasma reaction chamber includes reducing the pressure within the plasma reaction chamber to optimize plasma residence time and increase the reaction rate, between the plasma and the material or coating to be removed from an item in the plasma reaction chamber.

The method 300 includes the step of generating 308 plasma. In one embodiment, the plasma is generated 308 in a plasma generation chamber. Generating 308 the plasma may include introducing a gas or gases into the plasma generation chamber. Step 308 also includes introducing energy into the plasma generation chamber to ionize the gas.

As discussed above, there are a variety of gases or combinations of gasses that may be used to create the plasma and there are a variety of ways to created energy for ionizing the gas or gases into plasma.

In one embodiment, generating 308 the plasma includes increasing the pressure within the plasma generating chamber. In one embodiment, increasing the pressure in the plasma generation chamber, includes providing a narrow orifice or orifices between the plasma generating chamber the plasma reaction chamber. In another embodiment, generating 308 the plasma includes creating a pressure differential of greater than about 2 torr between the plasma generation chamber and the plasma reaction chamber. In yet another embodiment, the generating 308 the plasma includes creating a pressure differential of greater than about 1 torr between the plasma generation chamber and the plasma reaction chamber. In one embodiment, one or more of the plasma generation chamber and the plasma reaction chamber are configured to operate between 0 and about 2 Torr. In another embodiment, one or more of the plasma generation chamber and the plasma reaction chamber are configured to operate between about 500 and about 900 mTorr.

Generating 308 the plasma may include reducing the plasma ion density of the plasma. In another embodiment, it may be advantageous to utilize high density plasmas to enhance plasma reactions in the plasma reaction chamber. In one embodiment, generating 308 plasma includes generating low energy ions in the plasma. In one embodiment, less than kW of energy are used to create the plasma. In another embodiment, between about 300 and about 600 W of energy is used to create the plasma.

Generating 308 the plasma may include increasing or decreasing the temperature within the plasma generation chamber. In one embodiment, the temperature used to generate plasma is less than 150° C. In another embodiment, the temperature used to generate plasma is below 80° C. The plasma generator is configured to provide a temperature within these ranges.

The resulting plasma may contain up to 99% of oxygen, hydrogen, nitrogen, fluorine, chlorine, other halogens, argon, helium, or one of the noble gasses. The plasma may contain bromine, carbon, chlorine, sulfur, or other metalloids or nonmetals.

Accordingly, gases, energy sources, energy applications, temperatures, pressures, and other factors may be chosen to customize the generated plasma for a particular purpose. Such plasma generation factors may be chosen, for example, to create or avoid a specific reaction with an item or item coating subjected to the plasma. Such factors may be chosen to increase or decrease the rate or ashing in the ashing process. Such factors may also be chosen to create certain ash characteristics or to otherwise allow the ashing process to be more easily monitored or controlled. For example, some sensors may more readily pick up certain plasma constituents, which might allow for more uniform or accurate material removal during the plasma ashing process. In one embodiment a particular plasma is created to optimally to remove a Parylene coating from an item by plasma ashing.

The step of generating 308 plasma may include generating plasma within the plasma reaction chamber itself.

The method 300 includes the step of applying 310 the plasma to a predetermined area of the item. In embodiments where the plasma is generating outside the plasma reaction chamber, this step includes introducing the plasma into the plasma reaction chamber.

The step of applying 310 the plasma to a predetermined area of the item may include applying a mask to the item prevent plasma exposure except to certain areas of the item. The mask may be of a type described above. In one embodiment, the item is a printed circuit board and the mask covers most of the printed circuit board, leaving exposed only the areas where a Parylene coating removal by plasma ashing is desired.

In step 310, the plasma may be configured and applied such that the material being removed by plasma ashing has a greater removal rate that the material of the underlying substrate or item that it coated. It will be appreciated that this makes it easier to stop the process before the underlying item or substrate is altered or damaged by the removal of the coating. In one embodiment, applying 310 the plasma is done such that ash rate of the exposed coating is up to 3 microns per minute. In other embodiments, the ash rate of the coating is greater than 0.1 microns per minute. In yet another embodiment, the ash rate of a Parylene coating is between about 0.01 microns per minute and about 1 micron per minute.

The plasma application step 310 may apply the plasma such that the coating material is removed by plasma reaction at least much faster than the item material. In another embodiment, step 310 is configured such that the coating material is removed at least 100 times faster than the item material. It will be appreciated that gas and energy sources, along with pressure and temperature can be chosen to control the ashing rate ratios between a particular coating and a particular item. In certain embodiments, applying the plasma and/or configuring the mask takes into consideration the uniformity or lack of uniformity of the coating thickness.

The plasma application step 310 may include preheating the plasma reaction chamber or the item prior to the application of plasma. In another embodiment, the plasma application step may include adjusting the heat of the plasma reaction chamber or the item during the application process. In other embodiments the plasma application step may include adjusting the pressure within the plasma reaction chamber before or during the application of plasma to the coated item.

The method 300 may include the step of determining 312 when to stop the ashing process. In one embodiment, this may include measuring the thickness of the coating to be removed and setting a plasma time and/or intensity constraint such that the ashing process is stopped after a certain amount of time corresponding to the measured amount of coating to be removed.

In another embodiment, the step of determining 312 when to stop the ashing process includes using one or more data inputs from a sensing, measuring, or analyzing device as discussed above. These inputs may be obtained prior to or during the ashing process. In one embodiment, determining 312 when to stop the ashing process includes utilizing at least one data input from the group of data inputs comprising a coating depth, a reaction time, a process time, an application time, a gas output, an energy output, an ambient temperature, an electron temperature, a material temperature, a pressure, a plasma composition, a material composition, an ash or particle composition, an ash or particle amount, an ash rate, an amount of material, an amount of plasma, a plasma density, plasma ion level, an energy level, an energy distribution, an energy field, a fluorescence, a polarization, a differential, a ratio, and a change or shift in any of the forgoing.

The method 300 may include stopping 314 the ashing process, removing 316 the item, and retaining 318 the mask for reuse. Other steps might include cleaning (not shown) or other preparation of the chambers or flow paths in the system. For example, it may be advantageous to perform oxygen cleaning of one or more chambers or flow paths prior or subsequent to performing the plasma generation or plasma ashing steps.

One or more of the steps of method 300 may be done automatically or manually. One or more of the steps of method 300 may be accomplished as part of a batch process or continuous process. It will be appreciated that a step of raising or lowering temperature or pressure or otherwise affecting an environment may be done at multiple stages before, during or after the process and may be combined with other process or method steps. Similarly, a step that includes, sensing, measuring, analyzing and the like may be performed before during or after the process and may be combined with other process or method steps. Additionally, the steps of the method outlined herein may be broken down into additional steps or combined into fewer steps.

In some embodiments, the method 300 includes placing the masked item in a UV chamber and generating UV. The method 300 may also include directing the UV radiation at the masked item to degrade the coating. This may be done prior to placing the masked item in a plasma reaction chamber. In some embodiments, the plasma reaction chamber may be utilized for the UV pretreatment process.

Figure 4:
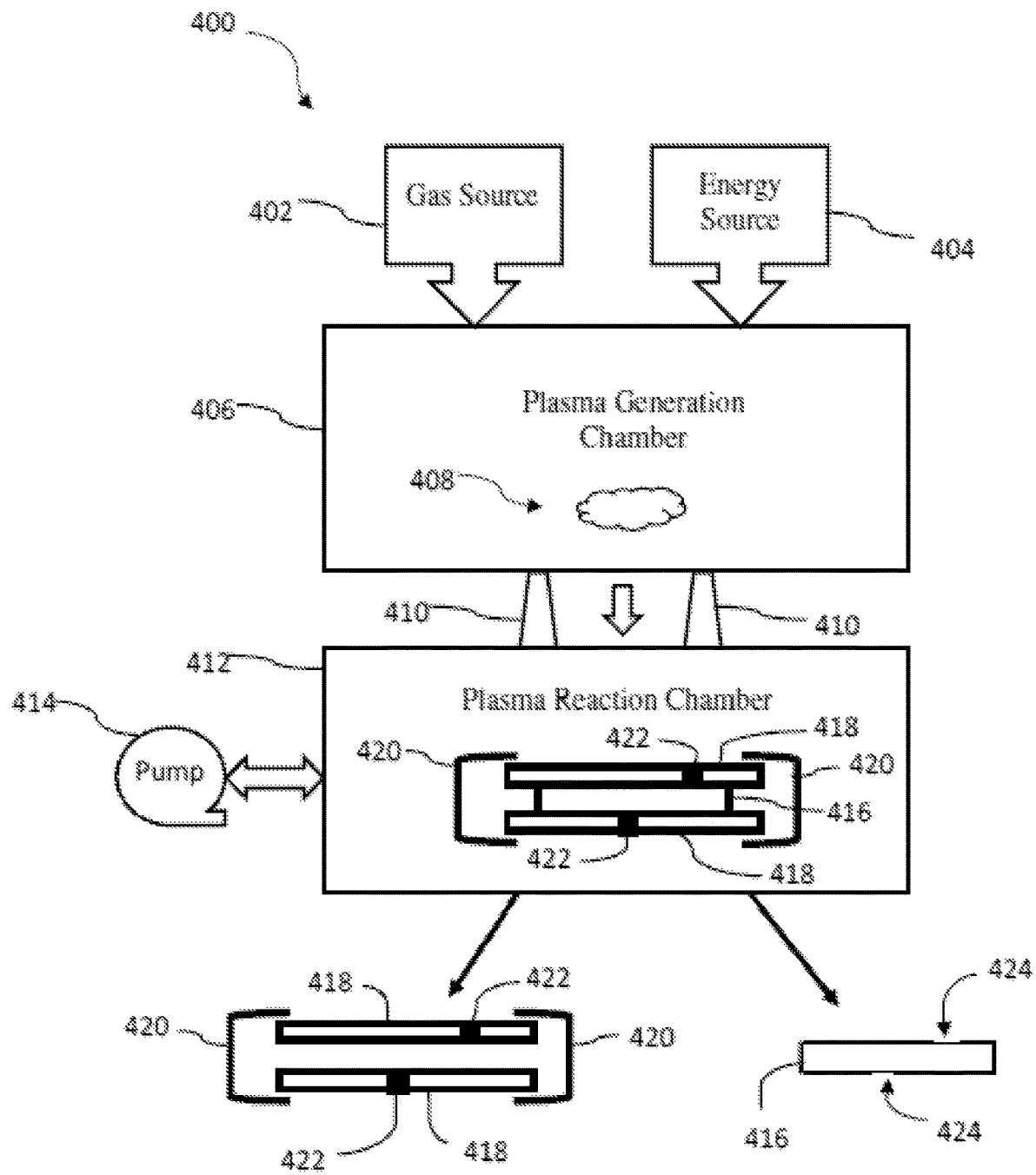
FIG. 4 depicts a schematic diagram of a process flow of a plasma ashing system in accordance with one or more embodiments of the present invention.

Referring now to FIG. 4, a schematic diagram of a process flow of an embodiment of a plasma ashing system 400 is shown. All or some of the features described in conjunction with FIGS. 1-3 may be incorporated into the embodiment shown in FIG. 4 and are only omitted for the sake of brevity. In addition, the features and components shown and described in conjunction with FIG. 4 may be incorporated into the embodiments shown in FIGS. 1-3. In addition, although the plasma ashing system 400 is shown and described with certain components and functionality, other embodiments of the plasma ashing system 400 may include fewer or more components to implement less or more functionality.

The plasma ashing system 400 includes a gas source 402 and an energy source 404. The gas source 402 provides a single or multi-component gas mixture which flows into a plasma generation chamber 406. The gas or gas mixture may be of a type described above. The energy source 404 provides energy to which the gas is exposed to generate a plasma 408. The energy source 404 may be any type, such that when the energy produced by it is applied to the gas, plasma is created. In one embodiment, the energy source is direct current generator, a radio frequency generator and/or a microwave generator as described above. The plasma is introduced through one or more openings or conduits 410 in a plasma reaction chamber 412. The openings 410 may be configured to created or control a pressure differential between the plasma generation chamber 406 and the plasma reaction chamber 412. The plasma reaction chamber 412 may be in operational communication with a pump 414. The pump 414 may be configured to evacuate the plasma reaction chamber 412 and/or create a vacuum, partial vacuum, or low pressures zone within the plasma reaction chamber 412.

The plasma reaction chamber 412 may be configured with means to hold a coated item 416 where it is desirous to remove some or all of the coating from the item by plasma ashing. In order to limit or control an area of the item 416 exposed to the plasma 408, and thus the area where material will be removed by plasma ashing, the item 416 may be placed in a mask 418. The mask may multiple pieces that are coupled together with a coupling 420 such that the item 416 is substantially enclosed or surrounded by the mask 418. The mask 418 may be configured with one or more openings 422 to allow predetermined areas of the item 416 to be exposed to the plasma 408.

After a desired amount of coating has been removed from the item 416, the masked item is removed from the plasma reaction chamber 412 and the item 416 is separated from the mask 418. The item will have areas 424 corresponding to the openings 422 in the mask 418 where coating has been removed. The mask 418 and/or couplings 420 may be retained for reuse.

Figure 5:
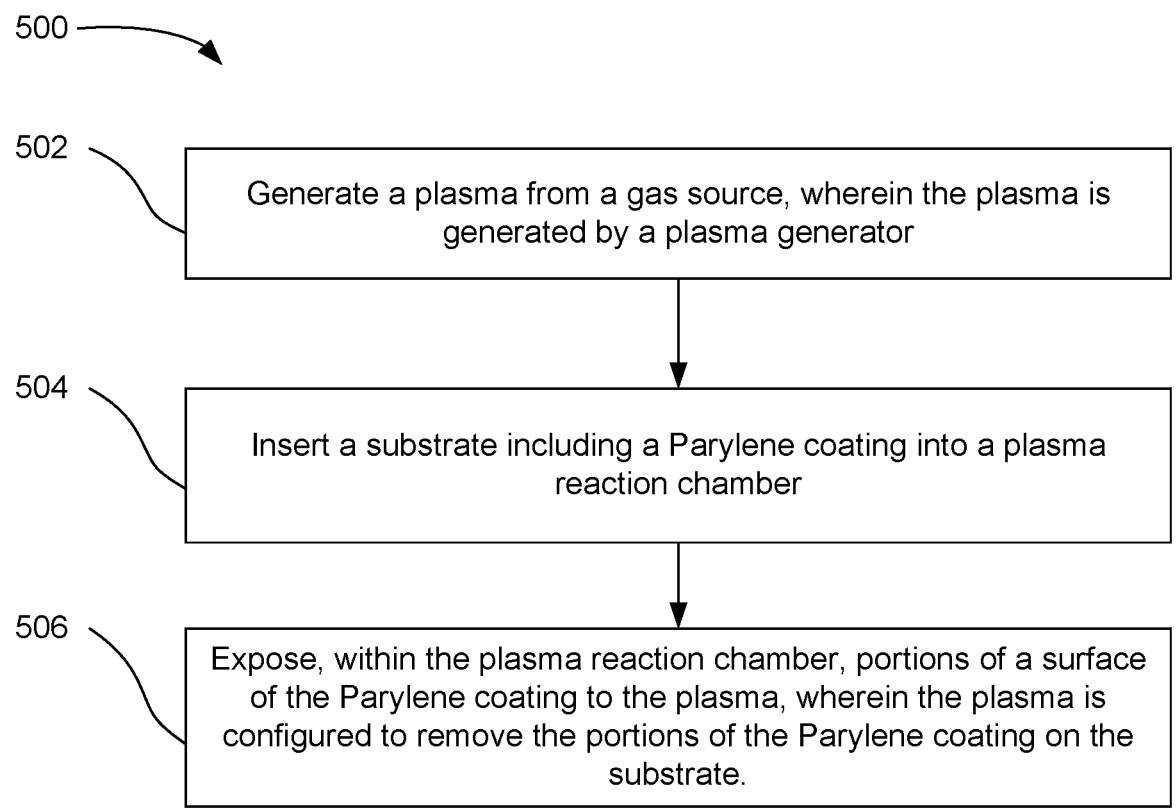
FIG. 5 depicts a flow chart diagram of a plasma ashing method for implementation with one or more of the plasma ashing systems in accordance with one or more embodiments of the present invention.

Referring now to FIG. 5, a flow chart diagram of a method 500 is shown. Although the method 500 is described in conjunction with the plasma ashing system, embodiments of the method 500 may be implemented with other types of plasma ashing systems.

At block 502, a plasma is generated from a gas source, wherein the plasma is generated by a plasma generator. At block 504, a substrate comprising a Parylene coating is inserted into a plasma reaction chamber. At block 506, portions of a surface of the Parylene coating to the plasma are exposed within the plasma reaction chamber, wherein the plasma is configured to remove the portions of the Parylene coating on the substrate.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The present subject matter may be embodied in other specific forms without departing from its spirit or essential characteristics. The described embodiments are to be considered in all respects only as illustrative and not restrictive.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

What is claimed is:

1. A plasma ashing system comprising:
a plasma generator configured to generate a plasma from a gas source;
a plasma reaction chamber configured to house a substrate comprising a Parylene coating, wherein the plasma reaction chamber is configured to expose surfaces of the Parylene coating on the substrate to the plasma, wherein the plasma is configured to remove portions of the Parylene coating on the substrate and heat the plasma reaction chamber; and a control processor configured to control a residence time and an ash rate for applying the plasma, wherein the system further comprises at least one sensor in the plasma reaction chamber, the at least one sensor configured to determine a stop time for the exposure, wherein the stop time is generated by determining a plasma composition and material composition of the Parylene coating.

2. The plasma ashing system of claim 1, further comprising a UV pretreatment system, wherein the UV pretreatment system is configured to apply UV radiation to the surfaces of the Parylene coating on the substrate prior to exposing the surfaces of the Parylene coating to the plasma.

3. The plasma ashing system of claim 1, wherein the gas source comprises an argon-, oxygen-, hydrogen-, or a nitrogen-containing gas, or a fluorocarbon gas, or a combination thereof.

4. The plasma ashing system of claim 1, further comprising a masking fixture configured to shield areas of the substrate from plasma ashing.

5. The plasma ashing system of claim 1, wherein the plasma is configured to heat the plasma reaction chamber.

6. The plasma ashing system of claim 1, wherein the plasma is generated in a plasma generation chamber separate from the plasma reaction chamber.

7. The plasma ashing system of claim 1, further comprising a masking fixture configured to shield areas of the substrate from plasma ashing, wherein the masking fixture is made of a material configured to withstand a temperature of up to 400° C., and wherein the masking fixture is configured to be reusable.

8. The plasma ashing system of claim 1, wherein the plasma reaction chamber is configured to remove only a selected portion of the Parylene coating on the substrate by applying a plasma to the selected portion of the Parylene coating.

9. A plasma ashing system comprising:
a UV pretreatment system, wherein the UV pretreatment system is configured to apply UV radiation to surfaces of a Parylene coating on a substrate;
a plasma generator configured to generate a plasma from a gas source; and
a plasma reaction chamber configured to house the substrate, wherein the plasma reaction chamber is configured to expose surfaces of the Parylene coating on the substrate to the plasma, wherein the plasma is configured to remove portions of the Parylene coating on the substrate and heat the plasma reaction chamber; and
a control processor configured to control a residence time and an ash rate for applying the plasma, wherein the system further comprises at least one sensor in the plasma reaction chamber, the at least one sensor configured to determine a stop time for the exposure, wherein the stop time is generated by determining a plasma composition and material composition of the Parylene coating.

10. The plasma ashing system of claim 9, wherein the plasma is generated in a plasma generation chamber separate from the plasma reaction chamber.

* * * * *